(12) United States Patent
Diez et al.

(10) Patent No.: US 9,246,114 B2
(45) Date of Patent: Jan. 26, 2016

(54) ORGANIC OPTOELECTRONIC COMPONENT AND USE OF A TRANSPARENT INORGANIC SEMICONDUCTOR IN A CHARGE CARRIER PAIR GENERATING LAYER SEQUENCE

(71) Applicant: OSRAM OLED GmbH, Regensburg (DE)

(72) Inventors: Carola Diez, Regensburg (DE); Thilo Reusch, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/401,134

(22) PCT Filed: May 6, 2013

(86) PCT No.: PCT/EP2013/059386
§ 371 (c)(1),
(2) Date: Nov. 14, 2014

(87) PCT Pub. No.: WO2013/171086
PCT Pub. Date: Nov. 21, 2013

(65) Prior Publication Data
US 2015/0102310 A1    Apr. 16, 2015

(30) Foreign Application Priority Data

May 16, 2012 (DE) .......................... 10 2012 208 173

(51) Int. Cl.
  *H01L 29/06* (2006.01)
  *H01L 31/00* (2006.01)
  *H01L 29/08* (2006.01)
  *H01L 35/24* (2006.01)
  *H01L 51/00* (2006.01)
  *H01L 51/42* (2006.01)
  *H01L 51/52* (2006.01)
  *H01L 51/50* (2006.01)

(52) U.S. Cl.
  CPC .......... *H01L 51/422* (2013.01); *H01L 51/5088* (2013.01); *H01L 51/5092* (2013.01); *H01L 51/5278* (2013.01); *H01L 2251/301* (2013.01); *H01L 2251/305* (2013.01)

(58) Field of Classification Search
  None
  See application file for complete search history.

(56) References Cited

U.S. PATENT DOCUMENTS 8,816,329 B2    8/2014   Krause et al.
2006/0240278 A1  10/2006  Hatwar et al.
(Continued)

FOREIGN PATENT DOCUMENTS

DE    102008054234 A1    5/2010
DE    102010062954 A1    6/2012
(Continued)

OTHER PUBLICATIONS

Lee, T. et al., "High-efficiency stacked white organic light emitting diodes", Appl. Phys. Lett. 92, 043301, 2008, pp. 043301-1-043301-3.
(Continued)

*Primary Examiner* — Calvin Choi
(74) *Attorney, Agent, or Firm* — Viering, Jentschura & Partner

(57) ABSTRACT

Various embodiments may relate to an organic optoelectronic component with a layer structure for generating and separating charge carriers of a first charge carrier type and charge carriers of a second charge carrier type, the layer structure including a hole-conducting transparent inorganic semiconductor.

18 Claims, 6 Drawing Sheets

(56) References Cited

U.S. PATENT DOCUMENTS

| | | | |
|---|---|---|---|
| 2010/0139772 A1* | 6/2010 | Frank et al. | 136/261 |
| 2010/0213438 A1* | 8/2010 | Cho et al. | 257/13 |
| 2011/0297922 A1* | 12/2011 | Krause et al. | 257/40 |
| 2014/0008623 A1 | 1/2014 | Heuser et al. | |
| 2014/0048785 A1 | 2/2014 | Heuser et al. | |

FOREIGN PATENT DOCUMENTS

| | | |
|---|---|---|
| DE | 102011007052 A1 | 10/2012 |
| EP | 1521505 A1 | 4/2005 |
| EP | 1983805 A1 | 10/2008 |
| EP | 2309824 A1 | 4/2011 |
| JP | 2010092741 A | 4/2010 |
| WO | 2007044098 A1 | 4/2007 |
| WO | 2010062643 A1 | 6/2010 |
| WO | 2011046166 A1 | 4/2011 |

OTHER PUBLICATIONS

International Search Report issued in PCT/EP2013/059386 dated Jul. 26, 2013.

* cited by examiner

ORGANIC OPTOELECTRONIC COMPONENT AND USE OF A TRANSPARENT INORGANIC SEMICONDUCTOR IN A CHARGE CARRIER PAIR GENERATING LAYER SEQUENCE

RELATED APPLICATIONS

The present application is a national stage entry according to 35 U.S.C. §371 of PCT application No. PCT/EP2013/059386 filed on May 6, 2013, which claims priority from German application No. 10 2012 208 173.9 filed on May 16, 2012, and is incorporated herein by reference in its entirety.

TECHNICAL FIELD

Various embodiments relate to an organic optoelectronic component; in particular, it relates to an organic optoelectronic component with a charge carrier pair generating layer, and also to the use of a transparent inorganic semiconductor in a charge carrier pair generating layer sequence of an organic optoelectronic component.

BACKGROUND

An optoelectronic component is designed for the conversion of electrical energy into electromagnetic radiation, such as for example into visible light, or for the reverse process. It is possible to speak respectively of an emitter device or a detector device. If the functional layer for the energy conversion contains organic materials, such as for example organic semiconductor materials, organic doping materials or organic charge transporting materials, it is an organic optoelectronic component.

An example of an optoelectronic component as an emitter device is a light emitting device, in particular a light emitting diode (LED). The device typically includes electrodes, between which an active zone is arranged. The electrodes can be used to feed to the light emitting device an electric current, which is converted in the active zone into optical energy, i.e. electromagnetic radiation. The optical energy is coupled out of the light emitting device by way of a radiation coupling-out area.

One particular light emitting device is the organic light emitting diode (OLED). An OLED has in the active layer an organic electroluminescent layer or layer sequence, in order to convert electrical energy into electromagnetic radiation. When the OLED is in contact with a power source by way of the electrodes, different types of charge carrier are injected into the organic layer. Positive charge carriers, also referred to as holes, migrate through the organic layer from the anode in the direction of the cathode, while electrons migrate through the organic layer from the cathode in the direction of the anode. In this case, electrons and holes can recombine and states of excitation form in the organic layer, in the form of pairs of electrons and holes, known as excitons. The excitons can break down, with the emission of electromagnetic radiation.

A further example of an optoelectronic component is the detector device, in which optical radiation is converted into an electrical signal or into electrical energy. Such an optoelectronic component is for example a photodetector or a solar cell. A detector device also has an active layer arranged between electrodes. The detector device has a radiation entry side, by way of which electromagnetic radiation, for example light, infrared or ultraviolet radiation, enters the detector device and is passed to the active layer. In the active layer, an exciton is excited under the effect of the radiation, and in an electrical field is divided into an electron and a hole. Thus, an electrical signal or an electrical charge is generated and provided at the electrodes.

In all cases, a high efficiency of the conversion of electrical energy into electromagnetic radiation or for the reverse process is desirable. The present disclosure addresses the problem of providing an organic optoelectronic component that has improved intrinsic properties and performance features, such as for example has a greater homogeneity of the current density in the component or has a higher luminance in an OLED.

This problem is solved by an organic optoelectronic component as claimed in patent claim 1 and by the uses of a transparent inorganic semiconductor as claimed in patent claims 10 and 11.

SUMMARY

The various configurations of the embodiments described below apply in the same way, if analogously applicable, to the organic optoelectronic component and to the use of a transparent inorganic semiconductor.

Embodiments of the organic optoelectronic component have a layer structure. The layer structure is in this case designed for separating charge carriers of a first charge carrier type from charge carriers of a second charge carrier type. For example, the charge carriers of the first charge carrier type are holes and the charge carriers of the second charge carrier type are electrons. An example of such a layer structure is a charge carrier pair generating layer sequence or "charge generating layer" (CGL). An important function of the layer structure is that of separating charge carrier pairs (for example electron-hole pairs) under the effect of an external electrical field, so that the charge carriers of the first charge carrier type (for example electrons) are provided in a first region of the layer structure and the charge carriers of the second charge carrier type (for example holes) are provided in a second region of the layer structure.

Such a charge carrier pair generating layer sequence has for example a jump in potential or a built-in voltage. This jump in potential is advantageously oriented in such a way that the valence band or the HOMO energy level of a layer is brought energetically into the proximity of or into overlap with the conduction band or the LUMO energy level of the adjoining layer. The jump in potential or the built-in voltage can be influenced by various properties of the layers. These include the work function or the doping of the materials used. Similarly, the jump in potential or the built-in voltage is influenced by any forming of interfacial dipoles at a layer interface. The jump in potential or the built-in voltage may have the effect of causing a generation of electron-hole pairs and a separation of the charge carriers.

The layer structure includes a transparent inorganic semiconductor. A transparent inorganic semiconductor is a semiconductor that has in the range of visible light, i.e. in a wavelength spectrum from about 380 nm to 780 nm, a transmission coefficient of more than 50%, in particular of more than 80%. For this purpose, the transparent inorganic semiconductor generally has a bandgap of more than 3 eV between the valence band and the conduction band. Because many inorganic semiconductors that are transparent in the range of visible light are an oxide, they are often also referred to as transparent conductive oxides or TCOs. In the disclosure presented here, the term "transparent inorganic semiconductor" is to be understood as meaning generally such an inorganic semiconductor that is substantially transparent in that range of the wavelength spectrum of electromagnetic radiation in which one or more active layers of the optoelectronic component is/are functionally active. For example, for an organic light emitting device this concerns the visible spectrum. In another example, in which the organic optoelectronic component is configured as an IR sensor, the transparent inorganic semiconductor is substantially transparent in a wavelength range from 780 nm to 1 mm. In this configuration, the bandgap of the transparent inorganic semiconductor may be less than 3 eV.

Such a charge carrier pair generating layer sequence has in various embodiments a layer sequence including an n region and a p region. The n region is the term used to refer to a region in which the charge transport takes place primarily by freely movable electrons. The p region is the term used to refer to a region in which the charge transport takes place primarily by freely movable holes. Both the n region and the p region respectively include a transparent inorganic semiconductor or consist thereof. The use of inorganic semiconductors for the electron-conducting region and the hole-conducting region in the charge carrier pair generating layer sequence makes an efficient charge carrier separation possible. In addition, the use of inorganic semiconductors allows the charge carriers to be transported away out of the charge carrier pair generating layer sequence largely without any loss.

The use of transparent inorganic semiconductors in the charge carrier pair generating layer is accompanied by many advantages. Some of these are set out by way of example below.

In comparison with the use of organic semiconductors, the use of inorganic semiconductors allows a higher achievable charge carrier density in the charge carrier pair generating layer sequence. In addition, the charge carriers in inorganic semiconductors generally have a higher mobility than in organic semiconductors. Consequently, a lower resistance over the charge carrier pair generating layer sequence is achieved than for example when using an organic semiconductor material in the charge carrier pair generating layer sequence. Furthermore, use of transparent inorganic semiconductors allows the generation of high jumps in potential and interfacial dipoles, which result in a favorable band matching for the charge carrier separation. As a result of the great capacity of the charge carrier pair generating layer sequence for charge carrier separation, the voltage drop across the charge carrier pair generating layer sequence is reduced.

Furthermore, with an inorganic semiconductor, the probability of a chemical reaction at the interface is reduced. Thus, in comparison with use of organic semiconductors, a greater stability is achieved.

Because inorganic semiconductors have a higher melting point and a greater mechanical hardness in comparison with organic semiconductors, a charge carrier pair generating layer sequence with transparent inorganic semiconductors is more stable than a charge carrier pair generating layer sequence with organic semiconductors with respect to voltage peaks, for example when the optoelectronic component is switched on, or with respect to current peaks.

In addition, inorganic semiconductors have a greater dielectric strength than organic semiconductors. As a result, a charge carrier pair generating layer sequence with transparent inorganic semiconductors is also stable under high interfacial voltages or built-in voltages.

In some embodiments, an intermediate layer is arranged between the n region and the p region. This may be for example a thin, likewise transparent, insulating layer, in order to favorably influence the jump in potential between the n region and the p region or further increase the stability of the CGL. The intermediate layer may also have the task of generating states in the bandgap of the transparent semiconductors and thereby facilitate the charge separation in the charge carrier pair generating layer.

In some embodiments, the n region includes at least one of the following materials or a stoichiometric variant thereof, or consists thereof: $MoO_3$, $WoO_3$, $ReO_3$, $AlInO_2$ or $InSnO_2$.

Because of their specific work function, these materials are particularly suitable for use in the n region of a charge carrier pair generating layer sequence. For example, they have the following work functions:

| Material | Work function (eV) |
| --- | --- |
| $MoO_3$ | 6.65 |
| $WoO_3$ | 6.5 |
| $InSnO_2$ | 4.7 ... 5.1 |

In some embodiments, the p region includes at least one of the following materials or a stoichiometric variant thereof, or consists thereof: $CoO_2$, $BaCuSF$, $BaCuSeF$, $BaCuTeF$, $NiO$, $CuAlO_2$, $CuGaO_2$, $CuInO_2$, $Cu_2O$, $ZnCO_2O_4$, $ZnRh_2O_4$, $ZnIr_2O_4$, $SrCu_2O_2$, $LaCuOS$, $LaCuOSe$, $LaCuOTe$.

Because of their specific work function, these materials are particularly suitable for use in the p region of a charge carrier pair generating layer sequence. For example, they have the following work functions:

| Material | Work function (eV) |
| --- | --- |
| $BaCuSeF$ | 4.85 |
| $NiO$ | 3.7 |
| $CuAlO_2$ | 3.5 |
| $CuGaO_2$ | 3.2 |
| $Cu_2O$ | 2.5 |
| $SrCu_2O_2$ | 3.3 |
| $AgCoO2$ | 4.15 |

1. The materials mentioned for the n region and the p region are transparent inorganic semiconductors. They advantageously allow themselves to be deposited on the other layers of the organic optoelectronic component at substrate temperatures of less than 100° C. In particular, in this way damage to organic materials during the production of the component is avoided.
2. In some embodiments, the organic optoelectronic component has an active layer adjoining the layer structure. In this case, the arrangement is preferably made such that the n region is adjoining an organic electron conductor and the p region is adjoining an organic hole conductor.
3. In some embodiments, the active layer includes an electroluminescent material. The organic optoelectronic component is for example configured as an OLED.
4. In some embodiments, the layer structure is arranged between a first active layer and a second active layer. This allows an organic optical component with multiple separate active layers, i.e. functional independent layers, to be provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1A:
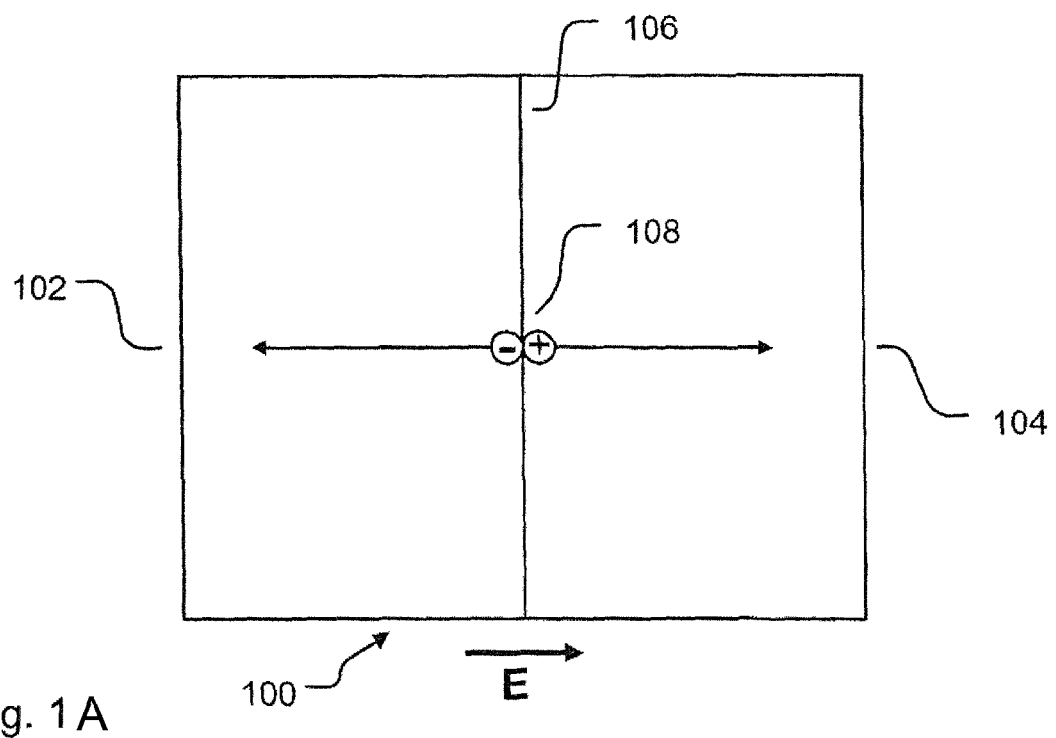
FIG. 1A shows a schematic representation of a first embodiment of a charge carrier pair generating layer sequence.
Figure 1B:
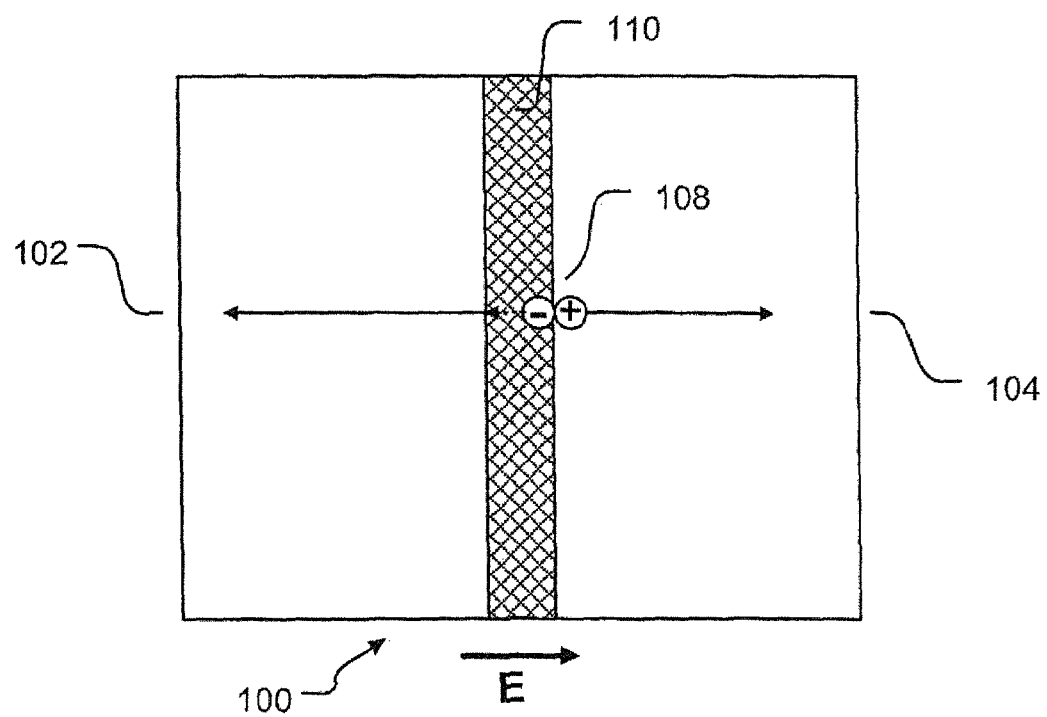
FIG. 1B shows a schematic representation of a second embodiment of a charge carrier pair generating layer sequence.

FIG. 1A and FIG. 1B respectively show a schematic representation of a first and a second embodiment of a charge carrier pair generating layer sequence 100.

The charge carrier pair generating layer sequence 100 has a layer sequence of transparent inorganic semiconductor materials in various configurations. In the first embodiment, represented in FIG. 1A, the charge carrier pair generating layer sequence 100 is configured as a layer sequence of an electron-conducting first semiconductor layer 102 and a hole-conducting second semiconductor layer 104. The first semiconductor layer 102 is also referred to as the n region. The second semiconductor layer 104 is also referred to as the p region.

The n region may include various transparent inorganic semiconductors or consist thereof. Suitable for example are metal oxides, such as for instance $MoO_3$, $WoO_3$ or $ReO_3$, which are thermally vaporizable and can therefore also be vapor-deposited onto organic semiconductor layers during a production process. Similarly suitable are electron-conducting delafossites, such as $AlInO_2$, which can be applied to organic or inorganic layers by means of pulsed laser deposition. Indium tin oxide (ITO) is also suitable as a material for the n region. ITO is already used in conjunction with organic electronics and can for example be applied by means of a sputtering operation. Finally, many other TCOs that are known for example in conjunction with transparent electrodes may also be used for the n region.

The p region may also include various transparent inorganic semiconductors or consist thereof. Suitable for example are materials such as BaCuSF, BaCuSeF, BaCuTeF, which can be deposited at room temperature by pulsed laser deposition. Oxides, such as for example NiO, can also be applied to an organic layer stack at room temperature, for instance by laser deposition. Likewise suitable are hole-conducting Cu-containing delafossites, such as for instance $CuMO_2$, where M is a trivalent cation, for instance Al, Se, Ga In, or else $CuO_2$, $CuY_{1-x}CA_xO_2$ or $CuCr_{1-x}Mg_xO_2$. These can be deposited by pulsed laser deposition or by means of sputtering methods. Zinc oxide compounds are also suitable. Thus, for example, $ZnM_2O_4$ can be used, where M can be selected from the group Co, Rh, Ir. These compounds can be deposited at room temperature, for example by pulsed laser deposition. $SrCu_2O_2$, LaCuOS, LaCuOSe or LaCuOTe can also be used as inorganic semiconductors for the p region. Similarly, doped materials, such as for instance Mg-doped $CuCrO_2$, are conceivable.

Formed between the first semiconductor layer 102 and the second semiconductor layer 104 is an interface 106. At the interface 106 there forms a jump in potential or a built-in voltage. The jump in potential or the built-in voltage is associated with an intrinsic electrical field E. In addition, to the component there may also be applied an external voltage, which can partly drop across the interface 106 and can likewise contribute to the electrical field.

A charge carrier pair or electron-hole pair 108 may occur spontaneously in the proximity of the interface 106. If the charge carrier pair 108 occurs in the second semiconductor layer 104, the electron may cross through the interface 106 and thus occupy a free state in the first semiconductor layer 102. In the second semiconductor layer 104 there initially remains an unoccupied state in the form of the hole. This separation of the charge carriers takes place under the influence of the electrical field at the interface, which at the same time prevents the immediate recombination of the electron-hole pair. By applying an external voltage, the electrons and holes can then be carried away to the anode and the cathode, respectively.

The transfer of the electron by way of the interface may take place by various processes. Thus, the transfer may take place by a tunneling process or by hopping processes via interfacial states that lie close to the bandgap of the semiconductors in the n region and the p region. The transfer processes may be isoenergetic or thermally activated with the participation of phonons. These processes are described below on the basis of the energy levels of such a system.

In the second exemplary embodiment, represented in FIG. 1B, a suitable intermediate layer 110 (interlayer) is arranged between the first semiconductor layer 102 and the organic semiconductor layer 104. The intermediate layer 110 serves for example as a potential barrier and/or as a barrier for the avoidance of interdiffusion processes or of chemical reactions between the between the first semiconductor layer 102 and the organic semiconductor layer 104. It includes for example a material from the class of phthalocyanines, for example $H_2Pc$, CuPc or ZnPc, nonconductive transparent oxides, such as for example $SiO_2$, $TiO_2$, $Al_2O_3$, nitrides, such as for example SiN, dielectrics, thin metal films (for example Ag or Al) or semi-insulating ZnO. With the aid of the intermediate layer 110, the charge carrier pair generating layer sequence 100 can be stabilized with regard to dielectric strength. By means of the intermediate layer 110, the potential barrier, in particular the width of the potential barrier, between the first semiconductor layer 102 and the second semiconductor layer 104 can be additionally configured. Thus, for example, the strength of a tunneling current occurring can be influenced. The intermediate layer 110 may also have the task of favorably influencing the jump in potential between the n region and the p region by changing the interfacial dipoles, or else serve for generating states in the bandgap of the transparent semiconductors and thereby facilitate the charge separation in the charge carrier pair generating layer sequence 100.

Energy Levels in the Charge Carrier Pair Generating Layer Sequence

Figure 2A:
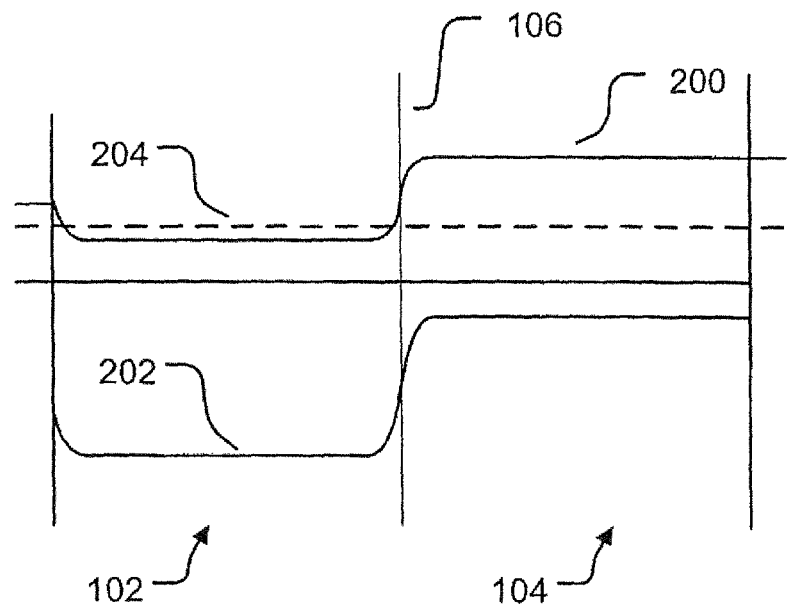
FIG. 2A shows a schematic representation of the energy levels in a charge carrier pair generating layer sequence according to the first embodiment without an applied voltage.

FIG. 2A shows a schematic representation of the energy levels in the charge carrier pair generating layer sequence 100 without an applied voltage. The charge carrier pair generating layer sequence 100 has the first semiconductor layer 102 as the n region and the second semiconductor layer 104 as the p region. Shown in FIG. 2A are the energy levels in the first semiconductor layer 102 and the second semiconductor layer 104. Indicated in each case are the conduction band 200 and the valence band 202 of the first semiconductor layer 102 and of the second semiconductor layer 104. The conduction band 200 indicates the energy range in which the charge transport predominately takes place by electrons. The valence band 202 indicates the energy range in which the charge transport predominately takes place by holes. Between the conduction band 200 and the valence band 202 there is a bandgap, which is large enough for the charge carrier pair generating layer sequence 100 to be substantially transparent in the spectral range that is emitted or detected by an organic optoelectronic component including it. For example, for the spectrum of visible light, the bandgap is greater than 3 eV. A bandgap of the first semiconductor layer 102 may in this case differ from a bandgap of the second semiconductor layer 104.

The first semiconductor layer 102 has a lower valence band and conduction band than the second semiconductor layer 104. At the interface 106, the energy levels merge continuously with one another by free charge carriers or possible dipole formations. An interfacial voltage or a jump in potential or a built-in voltage is formed. This interfacial voltage (built-in voltage) is associated with an intrinsic electrical field. The Fermi levels become alike and a transfer of free charge carriers occurs. In the case of doped layers, formation of a depletion zone may thus be induced. A band bending occurs at the interface 106. In this case, the level of the conduction band 200 in the first semiconductor layer 102 lies near or below a Fermi level 204, while the conduction band 200 in the second semiconductor layer 104 lies near or above the Fermi level 204. Consequently, only in the n region are states in the conduction band 200 occupied. The n region is electron-conducting.

Figure 2B:
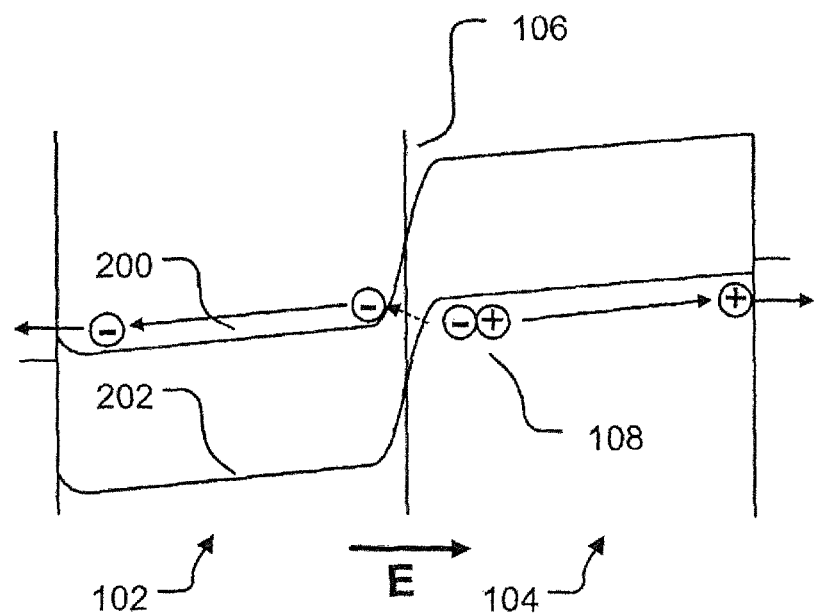
FIG. 2B shows a schematic representation of the energy levels in the charge carrier pair generating layer sequence according to the first embodiment with an applied blocking voltage.

FIG. 2B shows a schematic representation of the energy levels in the charge carrier pair generating layer sequence 100 when a blocking voltage is applied. The blocking voltage is associated with an electrical field E. On account of the blocking voltage, the energy levels in the semiconductor layers shift, in that they are tilted on account of the voltage drop across the charge carrier pair generating layer sequence 100. At the interface 106 there thus forms a region in which the conduction band 200 of the first semiconductor layer 102 assumes the same values as the valence band 202 of the second semiconductor layer 104. As a result of quantum fluctuations, a charge carrier pair 108 may form at the interface 106 in the second semiconductor layer 104. The charge carrier pair 108 consists of one electron and one hole. As a result of the band bending at the interface 106, there is a relatively high probability of the electron crossing through the potential barrier at the interface 106 in a tunneling process and occupying a free state in the conduction band 200 of the first semiconductor layer 102. As a result of the built-in voltage, or as a result of an externally applied voltage, charge carrier pairs are separated and the individual charge carriers are subsequently transported away.

The remaining hole is transported away out of the second semiconductor layer 104 by the electrical field E of the interfacial layer 106. The electron in the first semiconductor layer 102 is transported away by the falling conduction band 200 of the interfacial layer 106. As a result, by applying a blocking voltage, additional free charge carriers are provided at the charge carrier pair generating layer sequence 100 on account of intrinsic excitations.

Figure 2C:
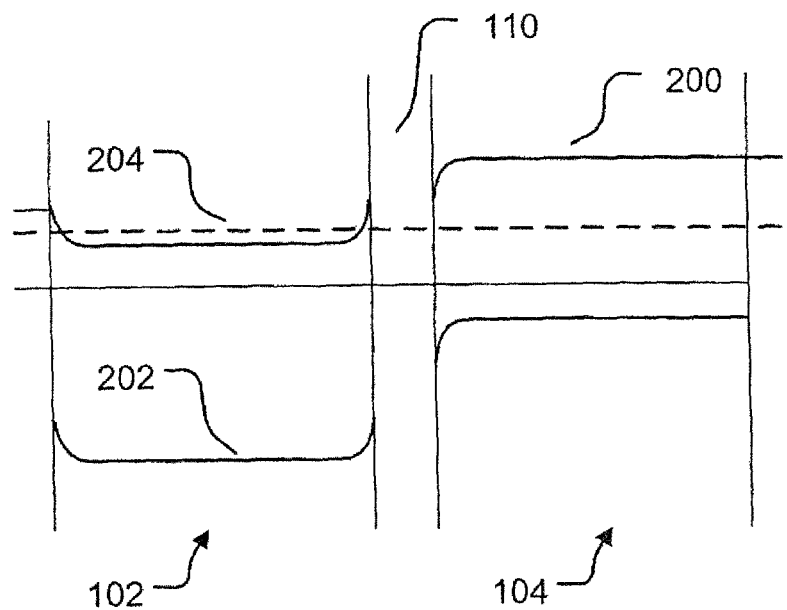
FIG. 2C shows a schematic representation of the energy levels in a charge carrier pair generating layer sequence according to the second embodiment without an applied voltage.
Figure 2D:
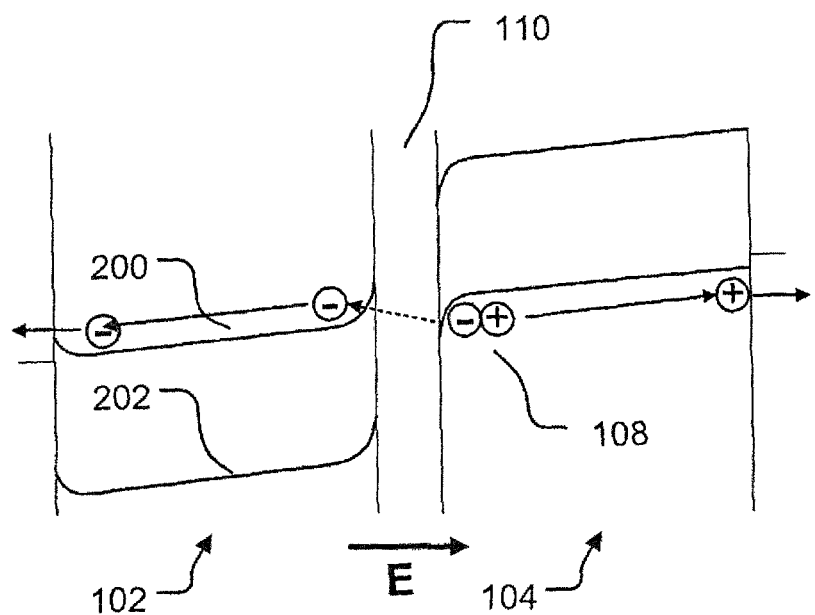
FIG. 2D shows a schematic representation of the energy levels in the charge carrier pair generating layer sequence according to the second embodiment with an applied blocking voltage.

FIG. 2C and FIG. 2D show the a schematic representation of the energy levels in the charge carrier pair generating layer sequence 100 according to the second embodiment. As a difference from FIG. 2A and FIG. 2B, the intermediate layer 110 (interlayer) of the second embodiment is shown. This intermediate layer provides a wider potential barrier between the energy levels in the first semiconductor layer 102 and the second semiconductor layer 104. As a result, a tunneling process through the potential barrier is required for the charge separation. A consequently resultant tunneling current is dependent on the width of the potential barrier. However, at the same time a recombination of the charge carriers is suppressed by the potential barrier. A separation of the charge carriers is maintained better as a result, so that it is made easier for the charge carriers to be transported away.

Figure 2E:
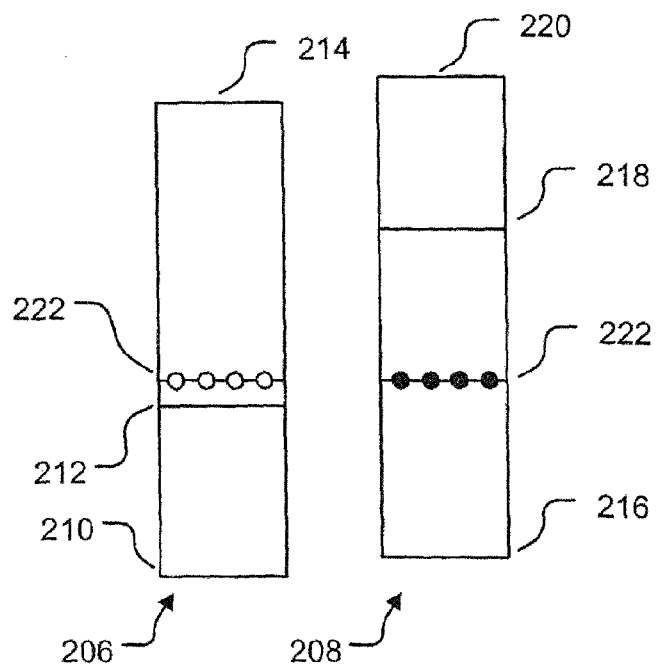
FIG. 2E shows a schematic representation of the energy levels in the charge carrier pair generating layer sequence with a hole-conducting transparent inorganic semiconductor material and an electron-conducting transparent inorganic semiconductor material.

FIG. 2E shows a schematic representation of the energy levels in the charge generating layer sequence with a hole-conducting transparent inorganic semiconductor material and an electron-conducting transparent inorganic semiconductor material. In this case, a first band edge 210 of the valence band and a second band edge 212 of the conduction band, lying above the first band edge, is shown for a hole-conducting transparent inorganic semiconductor material 206. The first band edge 210 and the second band edge 212 lie below a first vacuum energy 214 of the first inorganic semiconductor material 206.

Shown alongside that are a third band edge 216 of the valence band and a fourth band edge 218 of the conduction band, lying above the third band edge, for the for an electron-conducting transparent inorganic semiconductor material 208. The third band edge 216 and the fourth band edge 218 lie below a second vacuum energy 220 of the first inorganic semiconductor material 206.

The first band edge 210 lies below the third band edge 216, so that the valence band of the electron-conducting transparent inorganic semiconductor material 208 lies above the valence band of the hole-conducting transparent inorganic semiconductor material 206. Similarly, the first vacuum energy 214 is lower than the second vacuum energy 220. The conduction band of the electron-conducting transparent inorganic semiconductor material 208 also extends above the conduction band of the hole-conducting transparent inorganic semiconductor material 206, so that the fourth band edge 218 lies above the second band edge 212.

A Fermi level 222 of the system lies between the second band edge 212 and the third band edge 218. Consequently, states at the Fermi level 222 are occupied with holes in the hole-conducting transparent inorganic semiconductor material 206, while states at the Fermi level 222 are occupied with electrons in the hole-conducting transparent inorganic semiconductor material 206.

For example in the hole-conducting transparent inorganic semiconductor material 206, fluctuations may cause an electron to be transferred out of the conduction band of the hole-conducting transparent inorganic semiconductor material 206 into the electron-conducting transparent inorganic semiconductor material 206 and occupy there a free state below the Fermi level 222. The probability of such a fluctuation is defined essentially by the work function, i.e. by the difference between the second band edge and the first vacuum energy 214.

While an unoccupied state, i.e. a hole, thus remains in the hole-conducting transparent inorganic semiconductor material 206, a freely movable electron is provided in the electron-conducting transparent inorganic semiconductor material 208. Altogether, charge carriers are thus provided by way of an interfacial fluctuation.

First Embodiment of the Optoelectronic Component

Figure 3A:
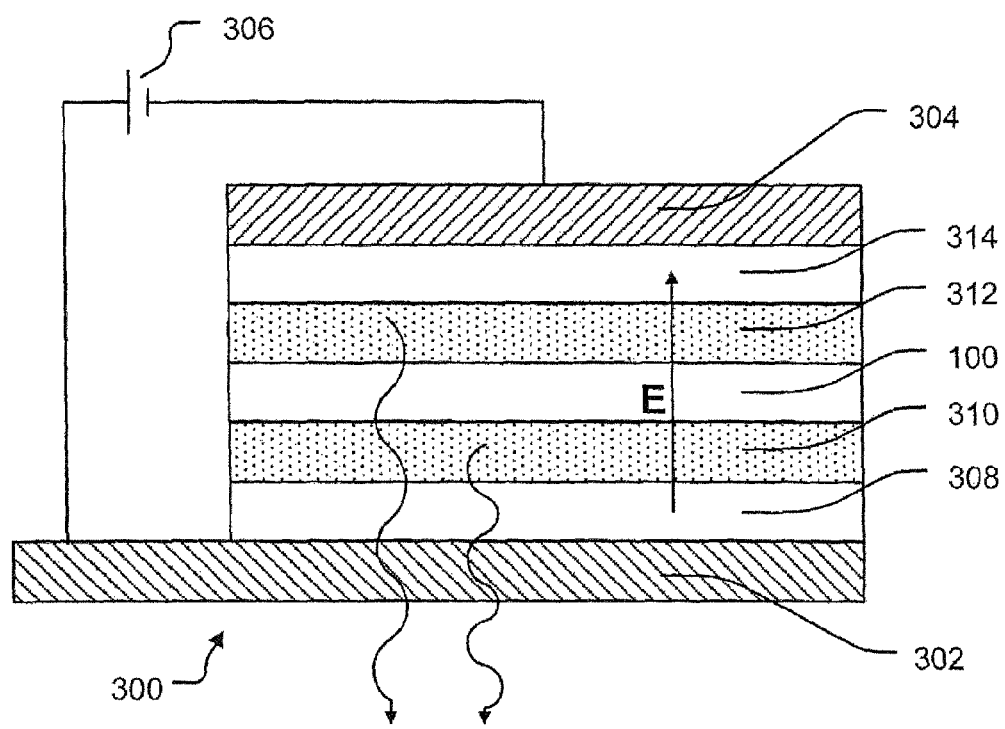
FIG. 3A shows a schematic representation of a first embodiment of an optoelectronic component.

FIG. 3A shows the schematic representation of a first embodiment of an organic optoelectronic component with a charge carrier pair generating layer sequence. The organic optoelectronic component 300 has an anode 302 and a cathode 304. The anode 302 and the cathode 304 serve as electrodes of the organic optoelectronic component 300. They are connected to an external power source 306. Arranged between the anode 302 and the cathode 304 is a layer stack including organic and inorganic semiconductor materials. The anode 302 and the cathode 304 respectively include an electrically conductive material, which may be chosen with regard to its optical properties. For example, the anode 302 and/or the cathode 304 may consist of a transparent material which contains a metal oxide, such as ITO, and/or a transparent, conductive polymer, or include a thin metal film. Similarly, at least one, either the anode 302 or the cathode 304, may consist of a highly conductive, reflective material, which for example contains a metal, for instance aluminum, silver, platinum, copper or gold, or a metal alloy.

Holes are injected into the layer stack by way of the anode 302, while electrons are injected into the layer stack by way of the cathode 304. At the same time, an electrical field E lies between the anode 302 and the cathode 304. The electrical field E has the effect that holes injected from the anode 302 migrate through the layer stack in the direction of the cathode 304. Electrons injected from the cathode 304 migrate under the influence of the electrical field E in the direction of the anode 302.

The layer stack has a series of different functional layers. Applied directly on the anode 302 is a hole-transporting layer 308. In some embodiments, a series of multiple hole-transporting layers is also provided. Applied on the hole-transporting layer 380 is a first active layer 310. The hole-transporting layer 308 serves for transporting holes injected from the anode 302 into the first active layer 310. It may for example include a p-doped conductive organic or inorganic material. Any suitable material may be used for the p doping. For example, the hole-transporting layer may be an organic hole conductor material (for example alpha-NPD), which is doped with tungsten oxide or a molybdenum oxide.

Because the charge carrier transport in organic semiconductors takes place predominantly by hopping or tunneling processes, the mobilities of holes and electrons may differ considerably. In order that exciton formation does not take place in the anode 302, but in particular in the first active layer 310, an electron-transport-blocking layer may also be provided between the anode 302 and the first active layer 310.

The layer stack also has a second active layer 312, which is separated from the first active layer 310 by a charge carrier pair generating layer sequence 100. The second active layer 312 is covered by an electron-transporting layer 314 and the cathode 304 arranged thereover. The electron-transporting layer 314 serves for the transport of electrons injected from the cathode 304 into a second active layer 312. It may for example include an n-doped conductive organic or inorganic material.

In addition to the electron- and hole-conducting layers and the active layers, further auxiliary layers may also be present, for example for adjusting and limiting the transport of electrons and holes or of excitons (known as electron, hole and exciton blockers).

The charge carrier pair generating layer sequence 100 serves for providing additional charge carrier pairs, in that it injects holes in the direction of the cathode 304 and electrons in the direction of the anode 302. Consequently, more charge carriers are provided for the first active layer 310 between the charge carrier pair generating layer sequence 100 and the anode 302. Similarly, more charge carriers are provided for the second active layer 312. This has the consequence that comparatively small currents can flow through the anode and the cathode. The associated advantage becomes clear from the example of an OLED. The function of the charge carrier pair generating layer sequence 100 can thus be graphically described by saying that it connects in series multiple individual OLEDs in the form of the active layers.

Figure 3B:
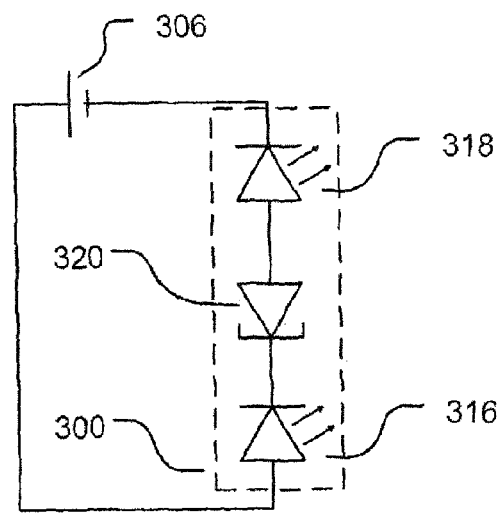
FIG. 3B shows an equivalent circuit diagram for the first embodiment of the optoelectronic component from FIG. 3A.

FIG. 3B shows an equivalent circuit diagram for the first embodiment of the optoelectronic component from FIG. 3A. The optoelectronic component 300 (represented by dashed lines) can be electrically indicated substantially by the series connection of a first diode 316 and a second diode 318. In this case, the diodes represent the non-ohmic, i.e. non-linear, behavior of the organic functional layers. The charge carrier pair generating layer sequence corresponds to an element 320, by which additional charge carriers are provided charge-neutrally within the series connection. This can be represented electrically equivalently by a reverse-biased tunnel diode. The intrinsic provision of charge carriers allows multiple protons per charge carrier pairs injected from the power source 306 to be emitted from the first diode 316 and the second diode 318. Thus, overall, the current efficiency, i.e. the ratio of emitted radiation to introduced electrical current (cd/A), of the optoelectronic component 300 is significantly increased in the case of all embodiments. Because a high luminance can be achieved even with small currents in the electrodes, the voltage drop across the flat-formed electrodes (anode or cathode) is reduced. As a result, a particularly homogeneous luminous image can be achieved with large-area OLEDs. A further advantage of the stacking of the active layers is that they only have to provide a low luminance in each case. On the one hand, a higher luminance is achieved over the same lifetime, or a longer lifetime is achieved with the same luminance as compared with an unstacked component. An essential aspect for the stacking of active layers in a layer sequence is that sufficient charge carriers are provided by way of the charge carrier pair generating layer sequence, and that the absorption of the radiation emitted in the active layer is largely avoided by the use of transparent inorganic semiconductors. At the same time, a small voltage drop across the charge carrier pair generating layer sequence is made possible by the high charge carrier mobility in inorganic semiconductors.

In the example of the OLED, both the first active layer 310 and the second active layer 312 are light emitting layers. For this purpose, the first active layer 310 and the second active layer 312 respectively include an organic electroluminescent material, by means of which the formation of excitons from charge carriers and a subsequent breakdown with the emission of electromagnetic radiation is induced. The choice of electroluminescent material is an area that is continually under further development. Among examples of such organic electroluminescent materials are:

(i) poly(p-phenylene vinylene) and its derivatives, substituted at various positions on the phenylene group;
(ii) poly(p-phenylene vinylene) and its derivatives, substituted at various positions on the vinylene group;
(iii) poly(p-phenylene vinylene) and its derivatives, substituted at various positions on the phenylene component and also at various positions on the vinylene group;
(iv) polyarylene vinylene, where the arylene may be such groups as naphthalene, anthracene, furylene, thienylene, oxadiazole and the like;
(v) derivatives of polyarylene vinylene, where the arylene may be as in (iv) above and additionally have substitutes at various positions on the arylene;
(vi) derivatives of polyarylene vinylene, where the arylene may be as in (iv) above and additionally have substitutes at various positions on the vinylene;
(vii) derivatives of polyarylene vinylene, where the arylene may be as in (iv) above and additionally have substitutes at various positions on the arylene and substitutes at various positions on the vinylene;
(viii) copolymers of arylene vinylene oligomers, such as for instance those in (iv), (v), (vi) and (vii) with non-conjugated oligomers; and,
(ix) poly(p-phenylene) and its derivatives, substituted at various positions on the phenylene groups, including conductor polymer derivatives such as for instance poly (9,9-dialkylfluorene) and the like;
(x) polyarylenes, where the arylene may be such groups as naphthalene, anthracene, furylene, thienylene, oxadiazole and the like; and their derivatives substituted at various positions on the arylene group;
(xi) copolymers of oligoarylenes, such as for instance those in (x) with non-conjugated oligomers;
(xii) polyquinoline and its derivatives;
(xiii) copolymers of polyquinoline with p-phenylene, substituted on the phenylene with for example alkyl or alkoxy groups, in order to obtain solubility; and
(xiv) rigid rod polymers such as for instance poly(p-phenylene-2,6-benzobisthiazole), poly(p-phenylene-2,6-benzobisoxazole), poly(p-phenylene-2,6-benzimidazole) and their derivatives.

Other organic emitting polymers, such as for instance those that use polyfluorene, include polymers that emit green, red, blue or white light, or their families, copolymers, derivatives or mixtures thereof. Other polymers include polyspirofluorene-like polymers.

Alternatively, instead of polymers, small organic molecules, which emit by way of fluorescence or by way of phosphorescence, may serve as the organic electroluminescent layer. Examples of small-molecule organic electroluminescent materials include:
(i) tris(8-hydroxyquinolinato)aluminum, ($Alq_3$);
(ii) 1,3-bis(N,N-dimethylaminophenyl)-1,3,4-oxidazole (OXD-8);
(iii) oxo-bis(2-methyl-8-quinolinato)aluminum;
(iv) bis(2-methyl-8-hydroxyquinolinato)aluminum;
(v) bis(hydroxybenzoquinolinato)beryllium ($BeQ.sub.2$);
(vi) bis(diphenylvinyl)biphenylene (DPVBI); and
(vii) arylamine-substituted distyrylarylene (DSA amine).

The first active layer 310 and the second active layer 312 may each be a white-emitting layer. This means that both the first active layer 310 and the second active layer 312 emit electromagnetic radiation in the entire visible spectrum. As a result of the stacking of two active layers, each of the first active layer 310 and the second active layer 312 needs only a low luminance, in spite of which a high luminance of the overall optoelectronic component 300 is achieved. It is particularly advantageous in this case that the inorganic semiconductors of the charge carrier pair generating layer sequence 100 arranged between the active layers has a high transparency in the range of visible light. As a consequence, a high light yield from the optoelectronic component is achieved.

The provision of the charge carrier pair generating layer sequence 100, through the injection of additional charge carriers into the adjoining active layers, increases the charge carrier density overall. For example, in an OLED, electron-hole pairs recombine in the active layers in an electroluminescent manner. The charge carrier pair generating layer sequence separates charge carriers again and consequently makes electron-hole pairs available for a second active layer. Processes such as for example the formation or dissociation of charge carrier pairs or excitons are enhanced. Since some of the charge carriers are provided in the charge carrier pair generating layer sequence 100, i.e. in the organic optoelectronic component 300 itself, a low current density can be achieved at the anode 302 and the cathode 304.

The first active layer 310 and the second active layer 312 may also emit electromagnetic radiation in spectra shifted with respect to one another. Thus, for example, the first active layer 310 may emit radiation in a blue color spectrum, while the second active layer 312 emits radiation in a green and red color spectrum. Such a second active layer 312 is also referred to as a "yellow functional block" or "yellow building block". Any other desired or suitable division is likewise conceivable. It is especially advantageous in this context that a division can be made according to different physical and chemical properties of emitter materials. For example, one or more fluorescent emitter materials may be incorporated in the first active layer 310, while one or more phosphorescent emitter materials are incorporated in the second active layer 312. The arrangement of the charge carrier pair generating layer sequence 100 already achieves a separation of the emitter materials, so that for example degradations due to diffusion or reaction of organic materials are prevented. Through the separation of the emission spectra of the two active layers, it is also possible in particular to establish a desired color locus of the optoelectronic component.

A further advantage of the stacking of the active layers is that the charge carrier transporting and recombination processes of the active layers are separated from one another. For example, in the case of a non-stacked OLED, the charge carriers in all the electroluminescent layers must recombine in fixed proportions. This means in turn that the charge carriers must cross through some of the electroluminescent layers without recombination. A changing of one electroluminescent layer therefore also always has an effect on the recombination in another. This mutual influence is advantageously suppressed by the separation of the electroluminescent layers by a charge carrier pair generating layer sequence.

Overall, the structure of an organic optoelectronic component with a charge carrier pair generating layer sequence 100 containing transparent inorganic semiconductors offers the possibility of providing particularly efficient optoelectronic components.

Second Embodiment of the Optoelectronic Component

Figure 4:
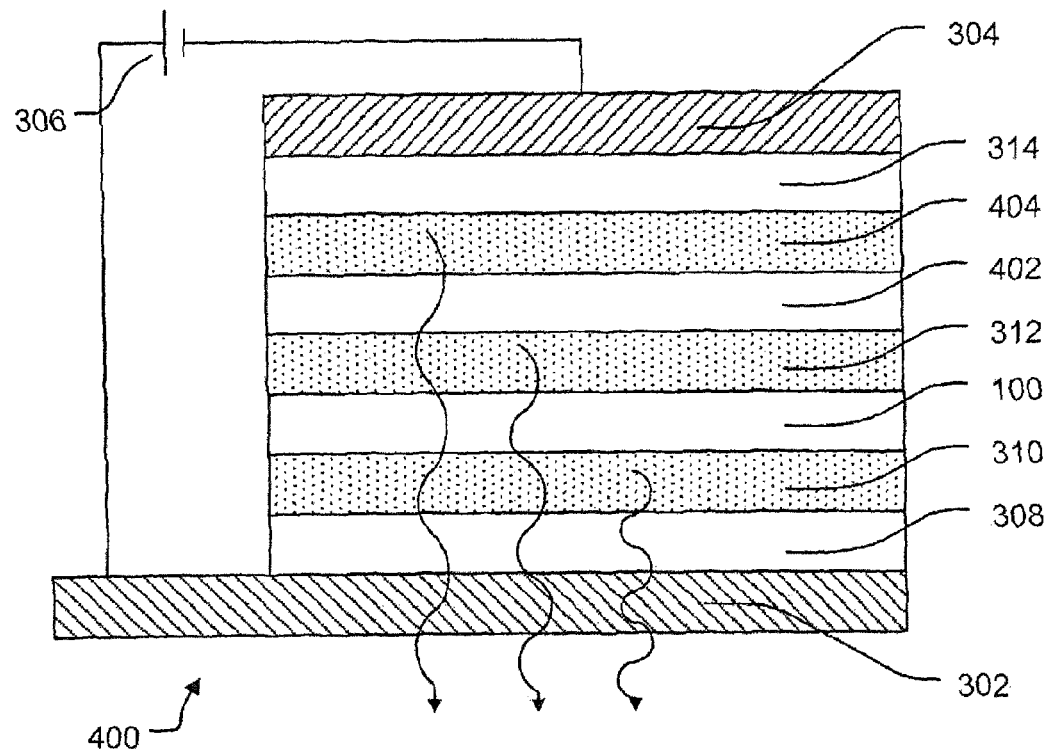
FIG. 4 shows a schematic representation of a second embodiment of an optoelectronic component and FIG. 5 shows a schematic representation of a third embodiment of an optoelectronic component.

FIG. 4 shows the schematic representation of a second embodiment of an organic optoelectronic component 400. In this case, the second exemplary embodiment differs from the first embodiment of FIG. 3A in the layer sequence between the anode 302 and the cathode 304. The layer stack of the second embodiment has a second charge carrier pair generating layer sequence 402 and a third active layer 404, which are arranged between the second active layer 312 and the electron-transporting layer 314.

The organic optoelectronic component 400 consequently has a stack structure including three active layers. The stack structure (or stacked device) may also have further stacks including a charge carrier pair generating layer sequence and an active layer. In principle, it is conceivable to provide a structure with any number of stacks. A stack structure with two active layers for example is also referred to as a tandem structure. Similar structures are known for example from document [1] or document [2], which are hereby included in the disclosure of the present application by reference.

The stack structure is suitable in particular for providing an OLED that emits white light. The embodiment with three different stacks, as in the case of the third exemplary embodiment, is particularly advantageous for this. It is thus possible, for example, to provide what is known as an "RGB emitter", in which a respective active layer emits a red, a green or a blue color spectrum. This allows an exact color locus of the spectrum emitted overall to be set. The division into three active layers allows for example each emitter material used to be incorporated in an optically optimum position within the layer stack. This allows effects to be taken into account, such as absorption of different wavelengths or refractive indices at interfaces.

It goes without saying that the aforementioned also applies in an analogous way to an organic optoelectronic component 400, in which at least one of the active layers acts as a detector.

Third Embodiment of the Optoelectronic Component

Figure 5:
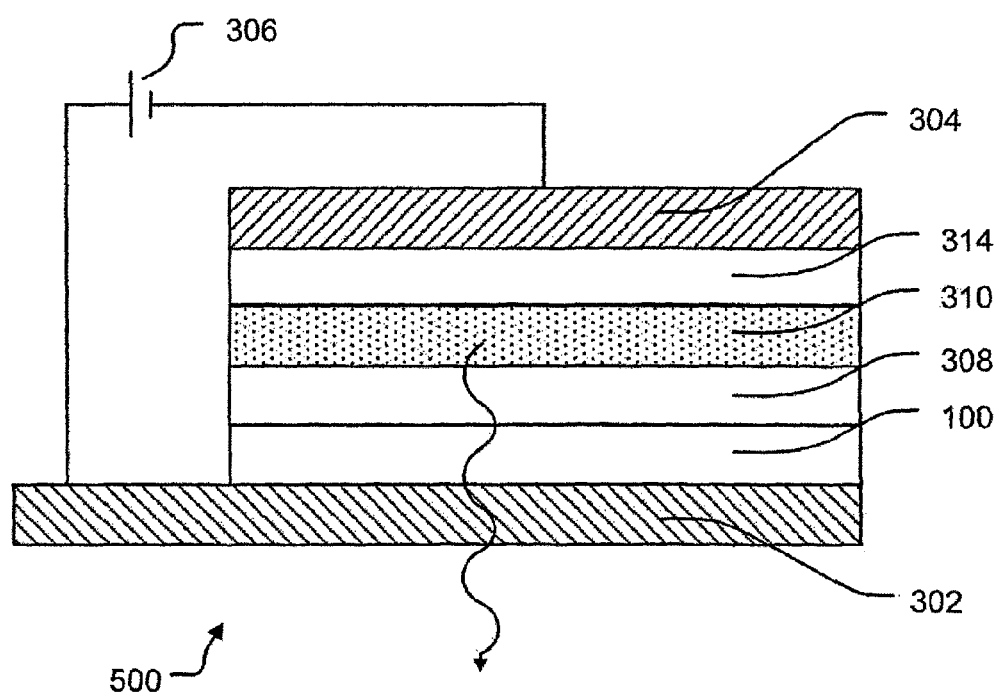

FIG. 5 shows the schematic representation of a third embodiment of an organic optoelectronic component 500 with a charge carrier pair generating layer sequence 100. The third embodiment differs from the first embodiment in that only one active layer 310 is provided. This is arranged between the electron-transporting layer 314 and the hole-transporting layer 308. The charge carrier pair generating layer sequence 100 is arranged between the anode 302 and the hole-transporting layer 308.

The arrangement of the charge carrier pair generating layer sequence 100 at the anode 302 allows charge carriers, i.e. especially holes, to be incorporated more easily in the layer stack. This is particularly suitable for suppressing effects resulting from a work function of the anode material, which may possibly lead to inhibition of the transport of holes into the layer stack. The charge carrier pair generating layer sequence 100 thus does not have the effect of providing additional charge carriers in the layer stack. Instead, it for example promotes the entry of charge carriers from metallic electrodes into organic materials in the layer stack. This function of the charge carrier pair generating layer sequence 100 can also be used in combination with the arrangements of the organic optoelectronic component of the first or second exemplary embodiment or in any other desired embodiments.

The organic optoelectronic component has been described to illustrate the underlying concept on the basis of several embodiments. The embodiments are not restricted here to specific combinations of features. Even if some features and configurations have only been described in connection with one particular embodiment or individual embodiments, they can in each case be combined with other features from other embodiments. It is similarly possible to omit or add individual features or particular configurations that are presented in embodiments, as long as the general technical teaching continues to be realized.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An organic optoelectronic component comprising one or more active layers and a layer structure for generating and separating charge carriers of a first charge carrier type and charge carriers of a second charge carrier type, the layer structure comprising a p-type region comprised of a hole-conducting transparent inorganic semiconductor and an n-type region comprised of an electron-conducting transparent inorganic semiconductor, wherein the hole-conducting transparent inorganic semiconductor and the electron-conducting transparent inorganic semiconductor have a transmission coefficient of more than 50% in that range of wavelength spectrum of electromagnetic radiation in which one or more active layers of the optoelectronic component is functionally active.

2. The organic optoelectronic component as claimed in claim 1, wherein the layer structure is a charge carrier pair generating layer sequence.

3. The organic optoelectronic component as claimed in claim 1, wherein an intermediate layer is arranged between the n-region and the p-region.

4. The organic optoelectronic component as claimed in claim 1, wherein the n-region comprises at least one of the following materials: $MoO_3$, $WO_3$, $ReO_3$, $AlInO_2$ or $InSnO_2$ or a stoichiometric variant of these compounds.

5. The organic optoelectronic component as claimed in claim 1, wherein the p-region comprises at least one of the following materials: BaCuSF, BaCuSeF, BaCuTeF, NiO, CuAlO2, CuGaO2, CuInO2, Cu2O, ZnCo2O4, ZnRh2O4, ZnIr2O4, SrCu2O2, LaCuOS, LaCuOSe, LaCuOTe or a stoichiometric variant of these compounds.

6. The optoelectronic component as claimed in claim 1, wherein one of the active layers comprises an electroluminescent material.

7. The optoelectronic component as claimed in claim 1, wherein the layer structure is arranged between a first active layer and a second active layer.

8. A method for generating and separating charge carriers of a first charge carrier type and charge carriers of a second charge carrier type by forming a layer structure comprising a p-type region comprised of a hole conducting transparent inorganic semiconductor and an n-type region comprised of an electron conducting transparent inorganic semiconductor, wherein the hole-conducting transparent inorganic semiconductor and the electron-conducting transparent inorganic semiconductor have a transmission coefficient of more than 50% in that range of wavelength spectrum of electromagnetic radiation in which one or more active layers of the optoelectronic component is functionally active.

9. A method for producing an organic light emitting device, the method comprising:

forming a layer structure with a charge carrier pair generating layer comprising a p-type region comprised of a hole conducting transparent inorganic semiconductor layer and an n-type region comprised of an electron conducting transparent inorganic semiconductor, wherein the hole-conducting transparent inorganic semiconductor and the electron-conducting transparent inorganic semiconductor have a transmission coefficient of more than 50% in that range of wavelength spectrum of electromagnetic radiation in which one or more active layers of the optoelectronic component is functionally active.

10. The organic optoelectronic component as claimed in claim 1, wherein one or more of the active layers is an organic active layer.

11. The organic optoelectronic component as claimed in claim 1, wherein the organic optoelectronic component is an organic light emitting device.

12. The organic light emitting device as claimed in claim 11, wherein an intermediate layer is arranged between the n-region and the p-region.

13. The organic light emitting device as claimed in claim 11, wherein the n-region comprises at least one of the following materials: $MoO_3$, $WO_3$, $ReO_3$, $AlInO_2$ or $InSnO_2$ or a stoichiometric variant of these compounds.

14. The organic light emitting device as claimed in claim 11, wherein the p-region comprises at least one of the following materials: BaCuSF, BaCuSeF, BaCuTeF, NiO, CuAlO2, CuGaO2, CuInO2, Cu2O, ZnCo2O4, ZnRh2O4, ZnIr2O4, SrCu2O2, LaCuOS, LaCuOSe, LaCuOTe or a stoichiometric variant of these compounds.

15. The organic light emitting device as claimed in claim 11, wherein one or more of the active layer comprises an electroluminescent material.

16. The organic light emitting device as claimed in claim 11, wherein the layer structure is arranged between a first active layer and a second active layer.

17. The organic optoelectronic component of claim 1, where the transmission coefficient is more than 80%.

18. The organic optoelectronic component of claim 3, wherein the intermediate layer comprises at least one of the following materials: a material from the class of phthalocyanines, a nonconductive transparent oxide, a nitride, a dielectric, a thin metal film, semi-insulating ZnO or a stoichiometric variant of these compounds.

* * * * *

UNITED STATES PATENT AND TRADEMARK OFFICE
CERTIFICATE OF CORRECTION

| | | |
|---|---|---|
| PATENT NO. | : 9,246,114 B2 | Page 1 of 1 |
| APPLICATION NO. | : 14/401134 | |
| DATED | : January 26, 2016 | |
| INVENTOR(S) | : Carola Diez et al. | |

It is certified that error appears in the above-identified patent and that said Letters Patent is hereby corrected as shown below:

In The Specification

Column 14, line 20: Please write "and an n-type region comprised of an electron-conducting transparent inorganic semiconductor," after the word "semiconductor," in place thereof.

Signed and Sealed this
Third Day of May, 2016

Michelle K. Lee
*Director of the United States Patent and Trademark Office*